(12) United States Patent
Hu et al.

(10) Patent No.: US 11,895,794 B2
(45) Date of Patent: Feb. 6, 2024

(54) STATE DETECTION APPARATUS AND METHOD FOR FOLDING SCREEN AND FOLDING SCREEN APPARATUS

(71) Applicant: BEIJING XIAOMI MOBILE SOFTWARE CO., LTD., Beijing (CN)

(72) Inventors: Xiankun Hu, Beijing (CN); Chunjie Lou, Beijing (CN)

(73) Assignee: BEIJING XIAOMI MOBILE SOFTWARE CO., LTD., Beijing (CN)

(*) Notice: Subject to any disclaimer, the term of this patent is extended or adjusted under 35 U.S.C. 154(b) by 354 days.

(21) Appl. No.: 17/331,363

(22) Filed: May 26, 2021

(65) Prior Publication Data

US 2022/0159857 A1 May 19, 2022

(30) Foreign Application Priority Data

Nov. 13, 2020 (CN) ......................... 202011273074.4

(51) Int. Cl.
| | |
|---|---|
| H05K 5/02 | (2006.01) |
| G01R 31/68 | (2020.01) |
| G06F 3/14 | (2006.01) |
| H05K 5/00 | (2006.01) |
| G06F 1/16 | (2006.01) |

(52) U.S. Cl.
CPC ........... H05K 5/0247 (2013.01); G01R 31/68 (2020.01); G06F 3/1423 (2013.01); H05K 5/0017 (2013.01); H05K 5/0226 (2013.01); G06F 1/1677 (2013.01)

(58) Field of Classification Search
CPC .............................. H05K 5/0247; G01R 31/68
See application file for complete search history.

(56) References Cited

U.S. PATENT DOCUMENTS

| 6,114,958 A | 9/2000 | Murphy |
|---|---|---|
| 2015/0205560 A1 | 7/2015 | Zhao |

FOREIGN PATENT DOCUMENTS

| CN | 102752422 A | * 10/2012 | |
|---|---|---|---|
| CN | 110196619 A | * 9/2019 | ........... G06F 1/1616 |
| CN | 111596726 A | 8/2020 | |

(Continued)

OTHER PUBLICATIONS

European Patent Application No. 21176793.4 extended Search and Opinion dated Nov. 29, 2021, 7 pages.

(Continued)

*Primary Examiner* — Minh Q Phan
(74) *Attorney, Agent, or Firm* — COZEN O'CONNOR

(57) ABSTRACT

A state detection apparatus and method for a folding screen and a folding screen apparatus. The state detection apparatus includes: at least one connection assembly, including a first component and a second component, the first component and the second component being electrically conductively coupled or decoupled correspondingly according to a motion state of the folding screen; and a detection assembly electrically coupled to the connection assembly, and configured to detect a state of electrical conduction connection or disconnection between the first component and the second component and determine a state of the folding screen according to the state of electrical conduction connection or disconnection between the first component and the second component.

17 Claims, 2 Drawing Sheets

(56) References Cited

FOREIGN PATENT DOCUMENTS

| | | | |
|---|---|---|---|
| EP | 3859502 A1 | | 8/2021 |
| JP | 2015190584 A | * | 11/2015 |
| JP | 2015190584 A | | 11/2015 |
| WO | WO 2020063135 A1 | | 4/2020 |

OTHER PUBLICATIONS

Chinese Patent Application No. 202011273074.4, Office Action dated Oct. 20, 2023, 6 pages.
Chinese Patent Application No. 202011273074.4, English translation of Office Action dated Oct. 20, 2023, 6 pages.

* cited by examiner

STATE DETECTION APPARATUS AND METHOD FOR FOLDING SCREEN AND FOLDING SCREEN APPARATUS

CROSS-REFERENCE TO RELATED APPLICATION

This application claims benefit of and priority to Chinese Patent Application Serial No. 202011273074.4, filed on Nov. 13, 2020, the entire content of which is incorporated herein by reference as if set forth in its entirety.

TECHNICAL FIELD

The present disclosure relates to the field of folding screen terminals, and more particularly, to a state detection apparatus and method for folding screen and a folding screen apparatus.

BACKGROUND

With the rapid development of mobile terminal technology, and in order to meet users' demand for larger screens, more and more mobile terminal devices are equipped with folding display screens. Rotating the folding display screen can change a state of the display screen and transform the mobile terminal into different forms, which present different human-computer interaction interfaces and help realize different human-computer interaction experiences. At present, detection schemes in related art for detecting state of folding screens require many devices, which is not only expensive, but also takes up more space inside the machine. Such design goes against the design objective of a light and thin machine, and may result in poor user experience.

SUMMARY

Embodiments of a first aspect of the present disclosure provide a state detection apparatus for a folding screen. The state detection apparatus includes: at least one connection assembly, including a first component and a second component, the first component and the second component being electrically conductively coupled or decoupled correspondingly according to a motion state of the folding screen; and a detection assembly electrically coupled to the at least one connection assembly, and configured to detect a state of electrical conduction connection or disconnection between the first component and the second component and determine a state of the folding screen according to the state of electrical conduction connection or disconnection between the first component and the second component.

Embodiments of a second aspect of the present disclosure provide a folding screen apparatus. The folding screen apparatus includes: a foldable display screen and a rotating shaft assembly, wherein the rotating shaft assembly is arranged in a folding position of the foldable display screen, and the foldable display screen is able to unfold or fold through the rotating shaft assembly; and a state detection apparatus for the foldable display screen. The state detection apparatus includes: at least one connection assembly, including a first component and a second component, the first component and the second component being electrically conductively coupled or decoupled correspondingly according to a motion state of the foldable display screen; and a detection assembly electrically coupled to the at least one connection assembly, and configured to detect a state of electrical conduction connection or disconnection between the first component and the second component and determine a state of the foldable display screen according to the state of electrical conduction connection or disconnection between the first component and the second component. At least one of the first component and the second component in the state detection apparatus is arranged on the rotating shaft assembly, and rotates circumferentially around a central axis of the rotating shaft assembly as the foldable display screen is unfolding or folding.

Embodiments of a third aspect of the present disclosure provide a state detection method for a folding screen, applied to the state detection apparatus according to the first aspect. The state detection apparatus includes: at least one connection assembly, including a first component and a second component, the first component and the second component being electrically conductively coupled or decoupled correspondingly according to a motion state of the folding screen; and a detection assembly electrically coupled to the at least one connection assembly, and configured to detect a state of electrical conduction connection or disconnection between the first component and the second component and determine a state of the folding screen according to the state of electrical conduction connection or disconnection between the first component and the second component. The method includes: acquiring an electrical signal indicating conduction or disconnection between the first component and the second component; and determining the state of the folding screen based on the electrical signal.

It should be understood that the above general description and the following detailed description are merely exemplary and explanatory and are not intended to limit the present disclosure.

BRIEF DESCRIPTION OF THE DRAWINGS

The drawings herein are incorporated into the specification and constitute a part of the specification, show embodiments consistent with the present disclosure, and together with the specification are used to explain the principles of the present disclosure.

DETAILED DESCRIPTION

Figure 1:
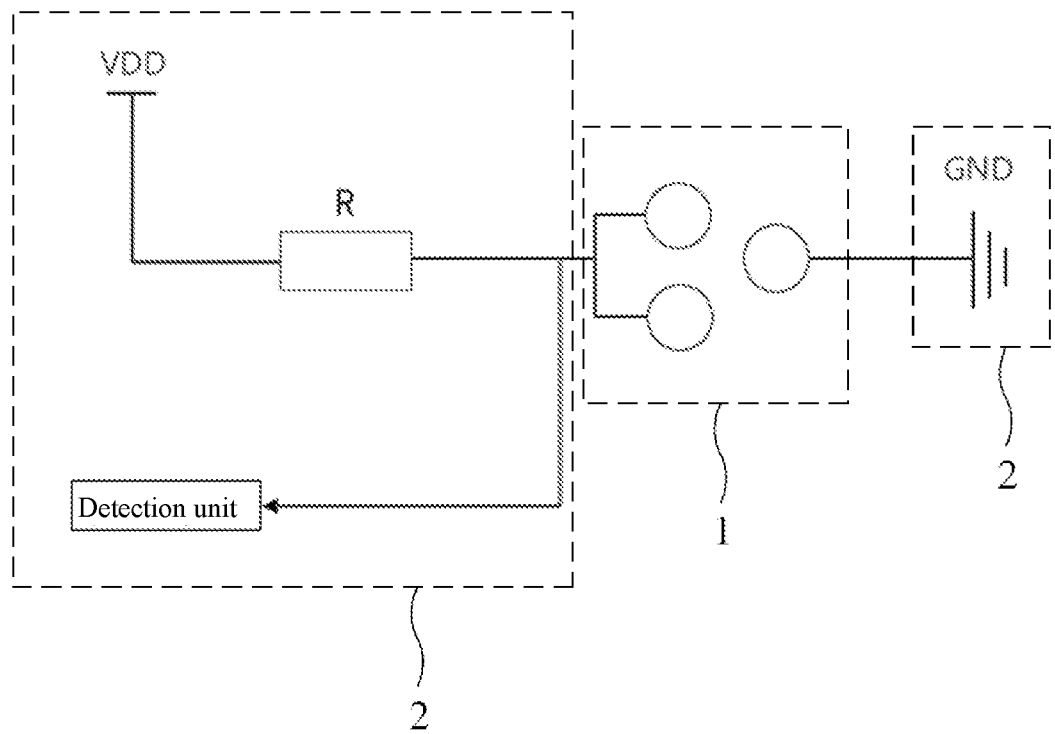
FIG. 1 illustrates a schematic structural diagram of a state detection apparatus for a folding screen according to an exemplary embodiment.

Exemplary embodiments will be described in detail here, and examples thereof will be shown in the drawings. In the following description involving the drawings, the same numerals in different drawings refer to the same or similar elements, unless indicated otherwise. The implementations described in the following exemplary embodiments do not represent all embodiments consistent with the present disclosure. Rather, they are merely examples of apparatuses and methods consistent with some aspects of the present disclosure as detailed in the claims.

Hall sensors are used in most of current folding screen terminal devices to detect unfolded and folded states of the folding screens. In general, a hall sensor system generally consists of two parts: a magnetic line sensor and a magnetic material. The magnetic line sensor is arranged in one display screen of the folding screen, and the magnetic material is arranged in the other display screen of the folding screen. The principle is that the magnetic line sensor in one display screen detects magnetic lines of force of the magnetic material in the other display screen to determine whether the two display screens are approaching or moving away from each other, so as to determine whether the folding screen is in the folded state or in the unfolded state. Compared with the Hall sensor, a gravity sensor and a gyroscope sensor are also used in the related art, and these two sensors are mounted in the two display screens of the folding screen respectively. Through the process of unfolding or folding, these two sensors detect the difference of gravity components in X, Y, and Z directions respectively, and a relative movement direction of the gyroscope, to determine whether the folding screen is in the folded state or in the unfolded state. However, this scheme, like the Hall sensor system, requires many parts, which not only causes high cost, but also occupies a large stacking space in the whole machine.

Embodiments of the present disclosure provide a state detection apparatus for a folding screen, which, as shown in FIG. 1, is applied to a mobile terminal device. The mobile terminal device includes a foldable display screen. The mobile terminal device may be electronic devices such as mobile phones, tablets, and wearable smart devices. In some embodiments of the present disclosure, based on structural changes of a rotating shaft assembly of the folding screen during opening and closing, a detection circuit is added to detect an electrical signal generated when the folding screen is unfolded (moving away) or folded (approaching). Thus, the structure is simple with fewer components, which can reduce power consumption and save costs, and can decrease a stacking space in the whole machine to make the terminal device lighter and thinner and optimize user experience of the mobile terminal device with the folding screen.

The state detection apparatus for the folding screen may include: at least one connection assembly 1, wherein each connection assembly 1 may include a first component 11 and a second component 12, and the first component 11 and the second component 12 are electrically conductively coupled or decoupled correspondingly according to a motion state of the folding screen; and a detection assembly 2, wherein the detection assembly 2 is electrically coupled to the at least one connection assembly 1 and is configured to detect a state of electrical conduction connection or disconnection between the first component 11 and the second component 12 and determine a state of the folding screen according to the state of electrical conduction connection or disconnection between the first component 11 and the second component 12.

Specifically, the state of the folding screen includes an unfolded state and a folded state. The state detection of the folding screen is to detect whether the folding screen is in the folded state or in the unfolded state. When an external force is applied to the folding screen to change the state of the folding screen, the state detection apparatus for the folding screen can accurately detect a current state of the folding screen.

The state detection apparatus for the folding screen may include at least one connection assembly 1. In this embodiment, the at least one connection assembly 1 per se may be used as a connection structure capable of connecting two display screens 3 of the folding screen, or the at least one connection assembly 1 may be arranged on a connection structure connecting two display screens of the folding screen. Regarding that each connection assembly 1 includes a first component 11 and a second component 12, it should be noted that the number of the first component 11 and the number of the second component 12 are not limited herein; and there may be one first component 11 and one second component 12, or a plurality of first components 11 and a plurality of second components 12. When the state of the folding screen changes, relative motion may be caused between the first component 11 and the second component 12 accordingly, and the relative motion may cause a connection or disconnection state between the first component 11 and the second component 12 correspondingly. In other words, the connection or disconnection state between the first component 11 and the second component 12 is generated synchronously as the folding screen switches between the folded state and the unfolded state.

Further, the connection between the first component 11 and the second component 12 may be insertion, articulation, or any other connections where contact can occur. When the first component 11 is coupled to the second component 12, the electrical conduction between the first component 11 and the second component 12 can be realized and an electrical signal can be generated in the circuit, regardless of the connection manner of the first component 11 and the second component 12. Further, the electrical signal may be converted into a detectable detection signal.

The state detection apparatus for the folding screen is further provided with a detection assembly 2. It needs to be noted that, the number of the detection assembly 2 is not limited, either. Since the detection assembly 2 is electrically coupled to the at least one connection assembly 1, a detection signal generated when the first component 11 and the second component 12 are electrically conductively coupled or decoupled can be received by the detection assembly 2. After receiving the detection signal, the detection assembly 2 determines, according to the detection signal, whether the folding screen is in the folded state or in the unfolded state.

Specifically, when the detection assembly 2 receives the detection signal transmitted from the at least one connection assembly 1, it indicates that the first component 11 and the second component 12 are electrically conductively coupled; when the detection assembly 2 does not receive the detection signal transmitted from the at least one connection assembly 1, it indicates that the first component 11 and the second component 12 are decoupled, and no electrical conduction connection is realized between them. Further, the detection assembly 2 determines the state of the folding screen according to design requirements of the folding screen. For example, when the detection assembly 2 receives the detection signal transmitted from the at least one connection assembly 1, it indicates that the first component 11 and the second component 12 are electrically conductively coupled, and in this case, the folding screen is in the unfolded state; when the detection assembly 2 does not receive the detection signal transmitted from the at least one connection assembly 1, it indicates that the first component 11 and the second component 12 are decoupled, no electrical conduction connection is realized, and in this case, the folding screen is in the folded state. Alternatively, when the detection assembly 2 receives the detection signal transmitted from the at least one connection assembly 1, it indicates that the first component 11 and the second component 12 are electrically conductively coupled, and in this case, the folding screen is in the folded state; when the detection assembly 2 does not receive the detection signal transmitted from the at least one connection assembly 1, it indicates that the first component 11 and the second component 12 are decoupled, no electrical conduction connection is realized, and in this case, the folding screen is in the unfolded state.

In this embodiment, the first component 11 and the second component 12 in the connection assembly 1 generate a detectable detection signal by contact. The detection assembly 2 can determine the folded state or unfolded state of the folding screen simply according to whether the detection signal from the connection assembly 1 is received. In the apparatus, a contact structure of the first component 11 and the second component 12 is simple to design and easy to implement, as long as the structure can satisfy the contact between the first component 11 and the second component 12, which includes but is not limited to pin contact, snap, lap, and other contact. In addition, the first component 11 and the second component 12 are electrically conductively coupled after coming into contact, and thus an electrical signal or a detection signal is generated. The detection assembly 2 can directly determine the state of the folding screen according to the detection signal, which simplifies the detection step. Therefore, parts and assemblies used for detection are correspondingly reduced, which lowers design costs, labor costs, parts costs, and power consumption during the use of parts. At the same time, the reduction of parts also makes the apparatus lighter and thinner.

In an embodiment, further, the at least one connection assembly 1 may be configured to: make the first component 11 and the second component 12 electrically conductively coupled when the folding screen is in the unfolded state, and make the first component 11 and the second component 12 decoupled when the folding screen is in the folded state.

In this embodiment, a structure that may be initially set or designed is as follows: the first component 11 and the second component 12 are electrically conductively coupled, and the folding screen is in the unfolded state; the first component 11 and the second component 12 are decoupled, and the folding screen is in the folded state.

Specifically, the folding screen may have at least two display screens 3. Currently, the display screens of the folding screen are mainly classified into inwardly foldable display screens and outwardly foldable display screens. The inwardly foldable display screens mean that display surfaces of the display screens are opposite and abut against each other in a folded state. The outwardly foldable display screens mean that rear surfaces of the display screens (i.e., surfaces away from the display screens) are opposite and abut against each other in a folded state. Taking inward folding as an example, in the folded state, the display surfaces of the display screens abut against each other while rear surfaces of the display screens are away from each other; in the unfolded state, the display surfaces of the two display screens are unfolded from the inside and get away from each other.

Assuming that one of two adjacent display screens 3 is a relatively stationary screen and the other one thereof is a relatively movable screen. In a process that the two display screens 3 of the folding screen change from the folded state to the unfolded state, a space region where the relatively movable screen passes is a first region, and a space region where the relatively movable screen does not pass is a second region. Specifically, when the display screens of the folding screen are inwardly foldable display screens, the first region is a region included between the display surfaces of the two display screens; the second region is a region included between the rear surfaces of the two display screens. Specifically, when the display screens of the folding screen are outwardly foldable display screens, the first region is a region included between the rear surfaces of the two display screens; the second region is a region included between the display surfaces of the two display screens.

A motion region between the first component 11 and the second component 12 of the connection assembly 1 may be located in the second region of the folding screen. When the folding screen is in the folded state, the first region obtains a minimum range and the second region obtains a maximum range; in this case, connection points of the first component 11 and the second component 12, which are used for the electrical conduction connection, are farthest away from each other, and the first component 11 and the second component 12 are decoupled. When the folding screen changes from the folded state to the unfolded state, the range of the first region gradually increases, the range of the second region gradually decreases, and a distance between the connection points of the first component 11 and the second component 12 also gradually decreases. When the folding screen is completely in the unfolded state, that is, the first region obtains a maximum range and the second region obtains a minimum range, the connection points of the first component 11 and the second component 12 are closest to each other; in this case, the first component 11 and the second component 12 change from a decoupled state to an electrically conductively coupled state.

When the first component 11 and the second component 12 are electrically conductively coupled, a circuit where the detection assembly 2 is located is closed and conductive, thus generating an electrical signal. The generated electrical signal is received by the detection assembly 2, so as to determine that the folding screen is in the unfolded state. When the first component 11 and the second component 12 are decoupled, the circuit where the detection assembly 2 is located is open and not conductive, thus failing to generate an electrical signal. Therefore, the detection assembly 2 cannot receive any electrical conduction connection signal of the first component 11 and the second component 12, and thus determines that the folding screen is in the folded state.

The first component 11 and the second component 12 are decoupled when the folding screen is in the unfolded state, and the first component 11 and the second component 12 are electrically conductively coupled when the folding screen is in the folded state.

In this embodiment, a structure that may be initially set or designed is as follows: the first component 11 and the second component 12 are electrically conductively coupled, and the folding screen is in the folded state; the first component 11 and the second component 12 are decoupled, and the folding screen is in the unfolded state.

Assuming that one of two adjacent display screens 3 is a relatively stationary screen and the other one thereof is a relatively movable screen. In a process that the two display screens 3 of the folding screen change from the folded state to the unfolded state, a space region where the relatively movable screen passes is a first region, and a space region where the relatively movable screen does not pass is a second region. Specifically, when the display screens of the folding screen are inwardly foldable display screens, the first region is a region included between the display surfaces of the two display screens; the second region is a region included between the rear surfaces of the two display screens. Specifically, when the display screens of the folding screen are outwardly foldable display screens, the first region is a region included between the rear surfaces of the two display screens; the second region is a region included between the display surfaces of the two display screens.

A motion region between the first component 11 and the second component 12 of the connection assembly 1 may be located in the first region of the folding screen. When the folding screen is in the folded state, the first region obtains a minimum range and the second region obtains a maximum range; in this case, connection points of the first component 11 and the second component 12 are closest to each other, and the first component 11 and the second component 12 are electrically conductively coupled. When the folding screen changes from the folded state to the unfolded state, the range of the first region gradually increases, the range of the second region gradually decreases, and a distance between the connection points of the first component 11 and the second component 12 also gradually increases. When the folding screen is completely in the unfolded state, that is, the first region obtains a maximum range and the second region obtains a minimum range, the connection points of the first component 11 and the second component 12 are farthest away from each other; in this case, the first component 11 and the second component 12 change from an electrically conductively coupled state to a decoupled state.

Therefore, in this embodiment, when the first component 11 and the second component 12 are electrically conductively coupled, a circuit where the detection assembly 2 is located is closed and conductive, thus generating an electrical signal. The generated electrical signal is received by the detection assembly 2, so as to determine that the folding screen is in the folded state. When the first component 11 and the second component 12 are decoupled, the circuit where the detection assembly 2 is located is open and not conductive, thus failing to generate an electrical signal. Therefore, the detection assembly 2 cannot receive any electrical conduction connection signal of the first component 11 and the second component 12, and thus determines that the folding screen is in the unfolded state.

It should be noted that, in this embodiment, the electrical conduction connection between the first component 11 and the second component 12 may be used to determine that the folding screen is in the unfolded state or in the folded state; similarly, the disconnection between the first component 11 and the second component 12 can also be used to determine that the folding screen is in the unfolded state or in the folded state, which depends on particular applications and design constraints of the technical solutions. Those skilled in the art may use different methods to implement the described functions for each particular application, but such implementations shall not be considered as going beyond the scope of the technical solutions of the embodiments of the present disclosure.

In this embodiment, the change between the folded state and the unfolded state of the folding screen is utilized to drive the first component 11 and the second component 12 in the connection assembly 1 to move, so that the component 11 and the second component 12 are coupled or decoupled, thus causing the corresponding electrical signal in the circuit to change. Accordingly, the folded state or the unfolded state of the folding screen can be determined. The steps are simplified and easy to operate.

In an embodiment, the first component 11 and/or the second component 12 is/are arranged on a rotating shaft assembly 4 of the folding screen, and rotate/rotates circumferentially around a central axis of the rotating shaft assembly 4 as the folding screen is unfolding or folding.

In this embodiment, the rotating shaft assembly 4 is a structure for articulating the two display screens 3 of the folding screen, to enable the two display screens 3 of the folding screen to relatively rotate, and the central axis is a virtual axis of the rotating shaft assembly 4. Assuming that the central axis is fixed, the two display screens 3 of the folding screen rotate circumferentially along the central axis, so that the folding screen can change from the folded state to the unfolded state. In addition, the term "and/or" refers to the existence of three situations. In the first situation, the first component 11 and the second component 12 are both arranged on the rotating shaft assembly 4 of the folding screen. In the second situation, the first component 11 is arranged on the rotating shaft assembly 4 of the folding screen. In the third situation, the second component 12 is arranged on the rotating shaft assembly 4 of the folding screen. The first situation and the second situation will be described in detail below through specific embodiments. The third situation is the same as the second situation, and thus will not be described in detail here.

In the first situation, the first component 11 and the second component 12 are both arranged on the rotating shaft assembly 4 of the folding screen.

Example 1: the connection assembly 1 is a part of the rotating shaft assembly 4, and implementation results are as follows:

The rotating shaft assembly 4 includes: a shaft lever and one shaft sleeve. The shaft sleeve is fitted over an outer side of the shaft lever and may rotate circumferentially relative to the shaft lever.

The two display screens 3 of the folding screen, namely the relatively movable screen and the relatively stationary screen are coupled to the shaft sleeve and the shaft lever respectively. Correspondingly, the first component 11 is arranged at a preset position on the shaft sleeve, the second component 12 is arranged at a preset position on the shaft lever, and when an external force is applied to the relatively movable screen to make the relatively movable screen move, the shaft sleeve is driven to rotate circumferentially relative to the shaft lever, so as to drive the first component 11 on the shaft sleeve to move relative to the second component 12 on the shaft lever, until the first component comes into contact with the second component 12 arranged on the shaft lever, to realize electrical conduction connection between the first component 11 and the second component 12. The first component 11 and the second component 12 are not uniquely arranged on the shaft lever and the shaft sleeve. The first component 11 may also be arranged on the shaft lever, and the second component 12 is arranged on the shaft sleeve.

Example 2: the connection assembly 1 is a part of the rotating shaft assembly 4, and implementation results may be as follows:

The rotating shaft assembly 4 includes: a shaft lever and at least one shaft sleeve. Each shaft sleeve is fitted over an outer side of the shaft lever and may rotate circumferentially relative to the shaft lever.

The two display screens 3 of the folding screen, namely the relatively movable screen and the relatively stationary screen are each coupled to one shaft sleeve. Correspondingly, the first component 11 is arranged at a preset position on the shaft sleeve coupled to the relatively movable screen, the second component 12 is arranged at a preset position on the shaft sleeve coupled to the relatively stationary screen, and when an external force is applied to both the relatively movable screen and the relatively stationary screen to make the two display screens 3 move relatively, the two display screens 3 both drive the corresponding shaft sleeves to rotate circumferentially relative to the shaft lever, so as to drive the first component 11 and the second component 12 on the two shaft sleeves respectively to move relative, until the first component 11 comes into contact with the second component 12, to realize electrical conduction connection between the first component 11 and the second component 12.

One of the first component 11 and the second component 12 is arranged on the rotating shaft assembly 4 of the folding screen.

Example 3: the first component 11 is arranged on the rotating shaft assembly 4 of the folding screen, and implementation results are as follows:

The rotating shaft assembly 4 includes: a shaft lever and one shaft sleeve. The shaft sleeve is fitted over an outer side of the shaft lever and may rotate circumferentially relative to the shaft lever.

The two display screens 3 of the folding screen, namely the relatively movable screen and the relatively stationary screen are coupled to the shaft sleeve and the shaft lever respectively. Correspondingly, the first component 11 is arranged at a preset position on the shaft sleeve coupled to the relatively movable screen, the second component 12 is arranged at a preset position on a structure such as a main board, the display screen 3, or a housing, and when an external force is applied to both the relatively movable screen and the relatively stationary screen to make the two display screens 3 move relatively, the two display screens 3 both drive the corresponding shaft sleeve to rotate circumferentially relative to the shaft lever, until the first component 11 on the shaft sleeve comes into contact with the second component 12 on the relatively stationary screen, to realize electrical conduction connection between the first component 11 and the second component 12.

Example 4: the first component 11 is arranged on the rotating shaft assembly 4 of the folding screen, and implementation results may be as follows:

The rotating shaft assembly 4 includes: a shaft lever and at least one shaft sleeve. Each shaft sleeve is fitted over an outer side of the shaft lever and may rotate circumferentially relative to the shaft lever.

The two display screens 3 of the folding screen, namely the relatively movable screen and the relatively stationary screen are each coupled to one shaft sleeve. Correspondingly, the first component 11 is arranged at a preset position on the shaft sleeve coupled to the relatively movable screen, the second component 12 is arranged at a preset position on a structure such as a main board, the display screen 3, or a housing, and when an external force is applied to both the relatively movable screen and the relatively stationary screen to make the two display screens 3 move relatively, the two display screens 3 both drive the corresponding shaft sleeve to rotate circumferentially relative to the shaft lever, until the first component 11 on the shaft sleeve comes into contact with the second component 12 on the relatively stationary screen, to realize electrical conduction connection between the first component 11 and the second component 12.

Similarly, the second component 12 is arranged on the rotating shaft assembly 4 of the folding screen, and implementation results are the same as those in example 3 and example 4, and thus are not described in detail here.

In addition, the first component 11 and the second component 12 of the connection assembly 1 may not be arranged on the rotating shaft assembly 4. For example, the first component 11 is arranged on the relatively movable screen, and the second component 12 is arranged on the relatively stationary screen.

It needs to be pointed out that, the structure of the rotating shaft assembly 4 and the relative position relationship among the first component 11, the second component 12 and the rotating shaft assembly 4 that are listed in this embodiment are only exemplary and cannot limit the protection scope of the technical solutions of the embodiments of the present disclosure.

In an embodiment, as shown in FIG. 1, the detection assembly 2 includes: a power supply VDD electrically coupled to the first component 11; a ground terminal GND electrically coupled to the second component 12; and a detection unit electrically coupled to one of the first component 11 and the second component 12, and configured to determine the state of the folding screen according to an electrical signal indicating the state of electrical conduction connection or disconnection between the first component 11 and the second component 12.

In this embodiment, a voltage of the power supply is preset to a low voltage of 1.8 V, the first component 11 of the connection assembly 1 is coupled to the power supply VDD, and the second component 12 is coupled to the ground terminal GND, so as to form a closed circuit. The detection unit is electrically coupled to the closed circuit to detect an electrical signal of the closed circuit. Specifically, when the first component 11 is electrically conductively coupled to the second component 12, there is a current when the circuit is closed; in this case, the detection unit may detect the electrical signal in the circuit. When the first component 11 is decoupled from the second component 12, the circuit is open and the current disappears; in this case, the detection unit cannot detect the electrical signal in the circuit. The folded state or unfolded state of the folding screen is determined according to whether the electrical signal in the circuit is detected. In this example, the detection unit is electrically coupled to the first component 11, and the detection unit may also be electrically coupled to the second component 12. When the detection unit is electrically coupled to the first component 11, the detection unit is located between the low-voltage power supply VDD and the first component 11. When he detection unit is electrically coupled to the second component 12, the detection unit is located between the second component 12 and the ground terminal GND.

Alternatively, a voltage of the power supply is preset to a low voltage of 1.8 V, the first component 11 of the connection assembly 1 is coupled to the ground terminal GND, the second component 12 is coupled to the low-voltage power supply VDD, and the working principle of the detection unit to detect the electrical signal is as above and thus is not described in detail here. In addition, in this example, the detection unit is electrically coupled to the first component 11, and the detection unit may also be electrically coupled to the second component 12. When the detection unit is electrically coupled to the first component 11, the detection unit is located between the first component 11 and the ground terminal GND. When he detection unit is electrically coupled to the second component 12, the detection unit is located between the low-voltage power supply VDD and the second component 12.

The detection unit may be coupled in series or parallel with the circuit. The detection unit and the power supply are both coupled to a preset interface of a main board. In the schematic diagram of this embodiment, the detection unit and the circuit of this embodiment are simple in structure and are easy to implement and maintain, have fewer parts and assemblies, and reduce the stacking of the whole machine space.

In an embodiment, the detection assembly 2 further includes: a resistor R coupled in series between the power supply VDD and the first component 11.

The resistor R is preset with large resistance. In this embodiment, a default value of the resistor R is 100 KΩ. Such a low voltage and large resistance can make the circuit produce a small current. On the one hand, it does not prevent the detection assembly 2 from detecting the current in the closed circuit. On the other hand, it reduces a leakage current when the first component 11 and the second component 12 are electrically conductively coupled, thus reducing the power consumption and reducing the cost.

In an embodiment, the first component 11 and the second component 12 each include a conductor portion, and the conductor portion of the first component 11 is in contact with the conductor portion of the second component 12, so that the first component 11 is in electrical conduction with the second component 12.

It can be seen that, since the first component 11 and the second component 12 need to generate electrical conduction, the first component 11 and the second component 12 need to be provided with a conductor portion capable of conducting electricity. The conductor portion is made of a material capable of conducting electricity, including, but not limited to, metals, semiconductors, superconductors, graphite, and other materials capable of conducting electricity.

Specifically, an overall structure of the first component 11 and an overall structure of the second component 12 may consist entirely of a conductor portion; or an overall structure of the first component 11 and a partial structure of the second component 12 consist of a conductor portion; or a partial structure of the first component 11 and an overall structure of the second component 12 consist of a conductor portion; or a partial structure of the first component 11 and a partial structure of the second component 12 consist of a conductor portion.

In this embodiment, an overall structure of the first component 11 and an overall structure of the second component 12 consist entirely of a conductor portion, and the conductor portion is made of a metal material. The metal material is easily available and has moderate rigidity and certain ductility, which not only is easy to process and form, simple in process, and low-cost but also has high stability and good electrical conductivity.

Figure 2:
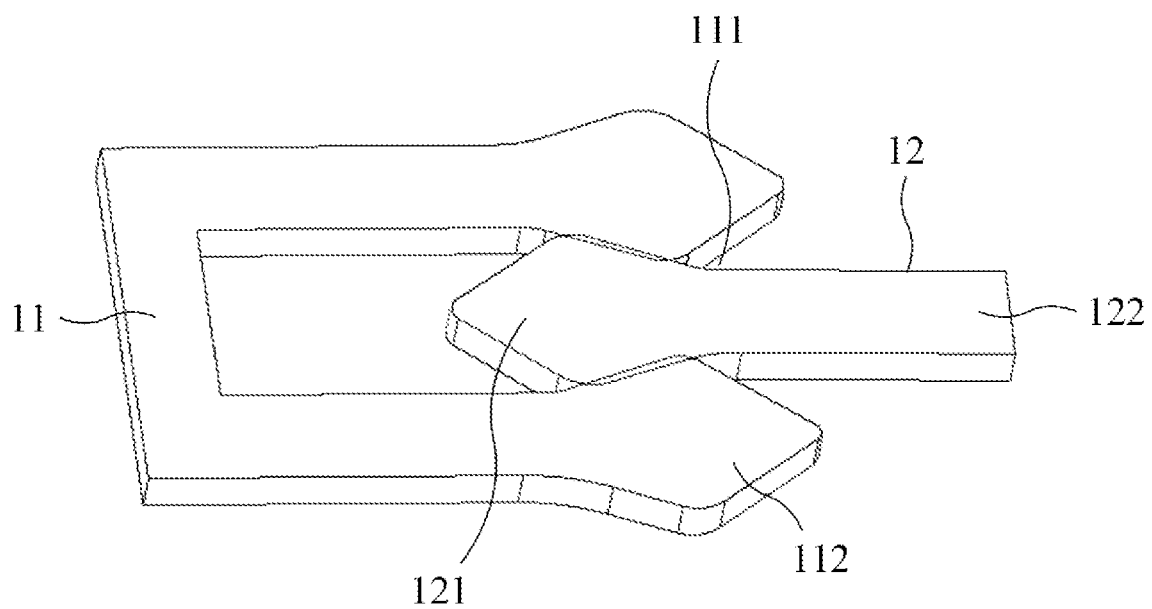
FIG. 2 illustrates a schematic structural diagram when a first component and a second component are coupled according to an exemplary embodiment.
Figure 3:
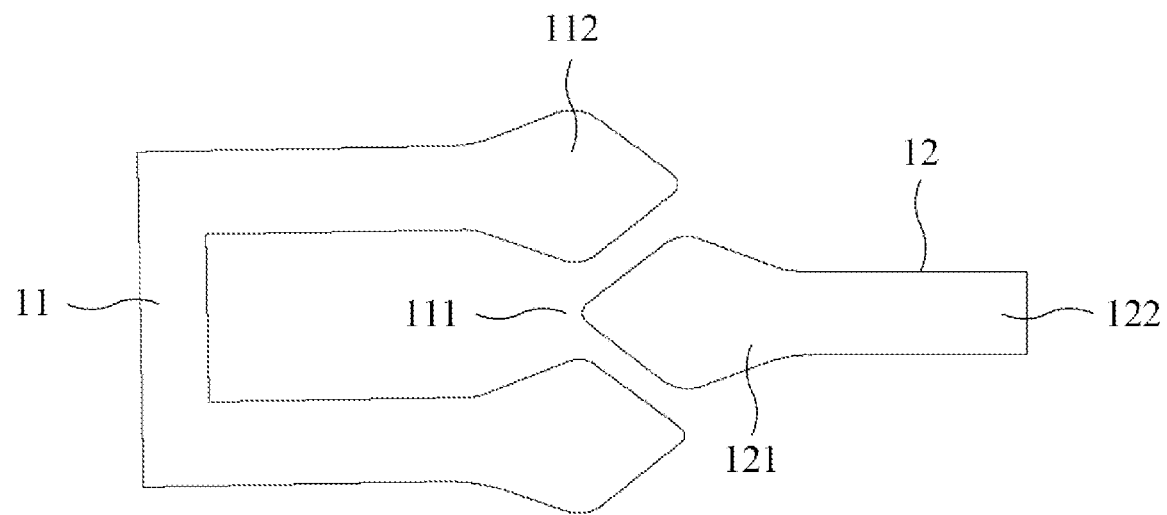
FIG. 3 illustrates a schematic structural diagram when a first component and a second component are decoupled according to an exemplary embodiment.

In an embodiment, as shown in FIG. 2 and FIG. 3, the first component 11 is a U-shaped structure with an opening 111, and an elastically deformable portion 112 is arranged at the opening; and the second component 12 has a first end portion 121. The second component 12 may be a strip structure, or a trapezoidal structure, or any structure set according to a design requirement. In this embodiment, the second component 12 is a strip structure having a first end portion 121 and a second end portion 122, and a maximum radial size of the second end portion 122 is less than that of the first end portion 121. A minimum radial size of the opening 111 is less than the maximum radial size of the first end portion 121 of the second component 12. The first end portion 121 of the second component 12 can be inserted into the first component 11 by elastic deformation of the elastically deformable portion 112, and the elastically deformable portions 112 are located on two sides in an insertion direction.

The elastically deformable portion 112 of the first component 11 and the first end portion of the second component 12 may have the same shape, including, but not limited to, a diamond structure, a circular structure, a square structure, and the like. In addition, the insertion direction is a direction where a motion path generated when the first component 11 and the second component 12 are coupled or decoupled.

In this embodiment, the elastically deformable portion 112 of the first component 11 and the first end portion 121 of the second component 12 have a diamond structure. Specifically, the elastically deformable portion 112 of the first component 11 has a funnel-shaped inlet, the opening 111 is at a position of the minimum radial size of the elastically deformable portion 112, and with the extension from the opening 111 into the U-shaped structure of the first component 11, the radial size increases linearly, showing an inverted funnel shape. The second end portion 122 of the second component 12 is one end away from the first component 11, and a cross section of the second end portion 122 is of a square structure. The first end portion 121 is formed in such a way that the second end portion 122 extends toward the first component 11 along the insertion direction, two sides of the second component 12 protrude symmetrically obliquely forward up to the maximum radial size of the first component 11, and then the two sides converge towards the first component 11 along the insertion direction. The first end portion 121 may protrude and narrow linearly or may protrude and narrow arcuately. The first end portion 121 in this embodiment is diamond-shaped, so it protrudes and narrows linearly. In addition, the first component 11 is rounded at the opening 111 and the second component 12 is rounded at its maximum radial size, to prevent stress concentration during insertion or disconnection of the first component 11 and the second component 12. In addition, the first component 11 and the second component 12 are less prone to cracking, the deformation can be reduced, and the service life can be prolonged.

When the first component 11 and the second component 12 are electrically conductively coupled, insertion connection and disconnection processes of the first component 11 and the second component 12 are as follows:

When the first component 11 and the second component 12 are electrically conductively coupled, the first component 11 and the second component 12 get close to each other along the insertion direction. When the first end portion 121 of the second component 12 is close to the first component 11, the first end portion 121 of the second component 12 is introduced along the funnel-shaped inlet of the elastically deformable portion 112, and the first end portion 121 continues moving along the insertion direction. When the first end portion reaches the opening 111 of the first component 11, since the minimum radial size of the opening 111 is less than the maximum radial size of the first end portion 121 of the second component 12, the first end portion 121 of the second component 12 begins to extrude the elastically deformable portion 112; in this case, the elastically deformable portion 112 elastically deforms in a direction perpendicular to the insertion direction to allow the first end portion 121 to be inserted. After the first end portion 121 of the second component 12 enters the U-shaped structure of the first component 11, since the size of the second end portion 122 of the second component 12 is less than that of the first end portion 121, the elastically deformable portion 112 of the first component 11 bounces back due to the reduced force; in this case, the elastically deformable portion 112 shows an inverted funnel-shaped structure to prevent, with the opening 111, the first end portion 121 of the second component 12 from slipping out and to hold the first end portion 121 tightly. In this case, the electrical conduction connection between the first component 11 and the second component 12 is completed, as shown in FIG. 2.

Similarly, when the first component 11 and the second component 12 are decoupled, in the beginning, the first end portion 121 of the second component 12 is located inside the U-shaped structure of the first component 11, and the first component 11 and the second component 12 are away from each other along the insertion direction under an external force. When the first end portion 121 of the second component 12 moves to the opening 111 of the first component 11, since the minimum radial size of the opening 111 is less than the maximum radial size of the first end portion 121 of the second component 12, when the first end portion 121 of the second component 12 continues outward extrusion, the first end portion 121 of the second component 12 begins to extrude the elastically deformable portion 112; in this case, the elastically deformable portion 112 elastically deforms in a direction perpendicular to the insertion direction to make the first end portion 121 detach. Since the size of the first end portion 121 is less than the size at the funnel-shaped inlet of the elastically deformable portion 112, the elastically deformable portion 112 no longer constrains the first end portion 121 of the second component 12. Afterwards, the first end portion 121 continuously exits from the funnel-shaped inlet of the elastically deformable portion 112. In this case, the disconnection of the first component 11 and the second component 12 is completed, as shown in FIG. 3.

It can be seen from the above structures of the first component 11 and the second component 12 that, when the first component 11 and the second component 12 of the connection assembly 1 is in a connection state, the elastically deformable portion 112 of the first component 11 engages with the first end portion 121 of the second component 12. The engagement of the first component 11 and the second component 12 may make an included angle or distance between the two display screens 3 of the folding screen at a preset angle or distance. Specifically, when the first component 11 and the second component 12 are coupled and the folding screen is in the unfolded state, the connection between the first component 11 and the second component 12 can support the folding screen to be in the unfolded state without folding under non-human force such as gravity. When the first component 11 and the second component 12 are coupled and the folding screen is in the folded state, the connection between the first component 11 and the second component 12 enables the folding screen to remain in the folded state without unfolding under non-human force. In addition, the electrical conduction connection or disconnection of the first component 11 and the second component 12 can also be realized according to opening and closing changes in a rotating shaft structure of the two display screens 3 of the folding screen, so as to determine the unfolded state or folded state of the folding screen. The structure and steps are simplified, the operation is convenient, and the judgment is accurate.

It may be further understood that, the terms such as "first" and "second" are used to describe various devices, but these devices should not be limited by these terms. These terms are used only to distinguish devices of the same type from each other and do not indicate a particular order or degree of importance. In fact, expressions such as "first" and "second" are completely interchangeable. For example, without departing from the scope of the present disclosure, a first component may also be referred to as a second component, and similarly, the second component may also be referred to as the first component.

Figure 4:
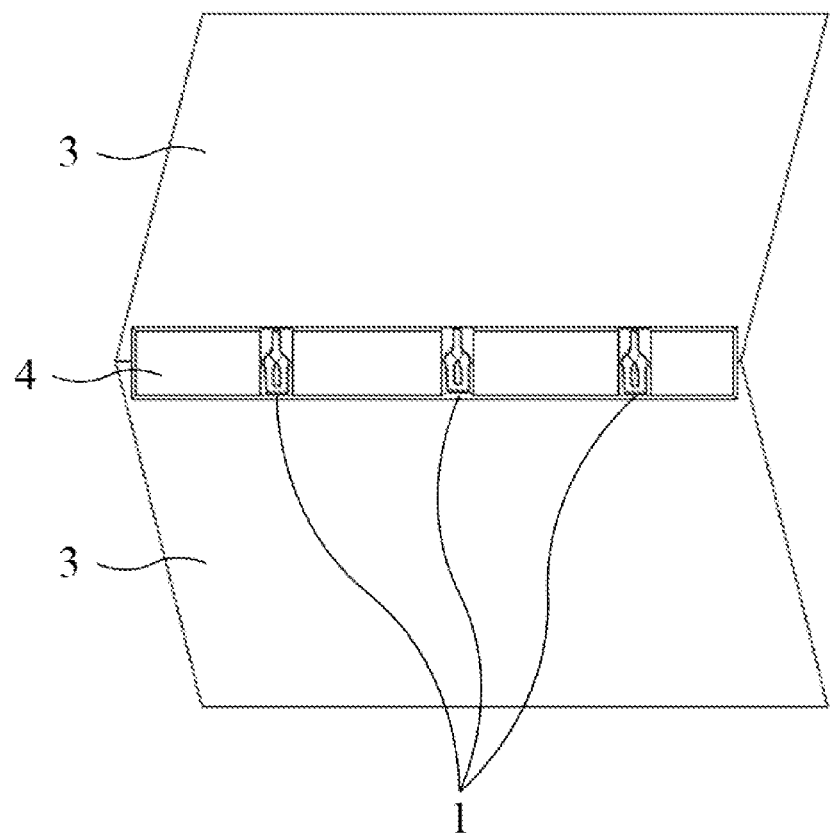
FIG. 4 illustrates a schematic structural diagram of a terminal device according to an exemplary embodiment.

In an embodiment, as shown in FIG. 4, a plurality of connection assemblies 1 are provided. Further, three to five connection assemblies 1 may be provided. In addition, the plurality of connection assemblies 1 are arranged at equal intervals along the central axis of the rotating shaft assembly 4. Specifically, since each connection assembly 1 includes a first component 11 and a second component 12, and it can be seen from the above contents that, the first components 11 of all the connection assemblies 1 may be arranged on the rotating shaft assembly 4, or the second components 12 of all the connection assemblies 1 may be arranged on the rotating shaft assembly 4, or the first components 11 and the second components 12 are all arranged on the rotating shaft assembly 4. When the plurality of first components 11 are arranged on the rotating shaft assembly 4, the plurality of first components 11 are arranged at equal intervals along the central axis of the rotating shaft assembly 4. When the plurality of second components 12 are arranged on the rotating shaft assembly 4, the plurality of second components 12 are arranged at equal intervals along the central axis of the rotating shaft assembly 4. When the first components 11 and the second components 12 are all arranged on the rotating shaft assembly 4, the plurality of connection assemblies 1 are arranged at equal intervals along the central axis of the rotating shaft assembly 4.

In this embodiment, all the connection assemblies 1 may be coupled to the detection assembly 2, or a part of the connection assemblies 1 are coupled to the detection assembly 2 and the remaining connection assemblies 1 are only used for connection and support. In this embodiment, the plurality of connection assemblies 1 are provided, so that the accuracy of determining the state of the folding screen by the detection assembly 2 can be improved, and when one or more connection assemblies 1 cannot realize electrical conduction connection, the remaining connection assemblies 1 do not affect the detection of the detection assembly 2. In the drawings of this embodiment, three connection assemblies 1 are provided.

It may be further understood that "a plurality of" in this embodiment means two or more, and other quantifiers are similar thereto. In addition, the number and number range of the connection assembly 1 are exemplary only and are not intended to limit the protection scope of the technical solution in this embodiment.

Based on the same inventive conception, embodiments of the present disclosure further provide a folding screen apparatus, including: a foldable display screen 3, a rotating shaft assembly 4, and a state detection apparatus for a folding screen. At least one of the first component 11 and the second component 12 in the state detection apparatus is arranged on the rotating shaft assembly 4, and rotates circumferentially around a central axis of the rotating shaft assembly 4 as the foldable display screen 3 is unfolding or folding. In an embodiment, the foldable display screen 3 is one flexible display screen or two separate display screens pivotally coupled through the rotating shaft assembly 4.

Specifically, the foldable display screen 3 may be two separate display screens or one flexible display screen, and the rotating shaft assembly 4 is arranged in a folding position of the foldable display screen 3. When the foldable display screen 3 includes two separate display screens, the rotating shaft assembly 4 is configured to pivot the two display screens 3. When the foldable display screen 3 is one flexible display screen, the rotating shaft assembly 4 is configured to connect the flexible display screen. The foldable display screen 3 can be unfolded or folded through the rotating shaft assembly 4, regardless of being pivoted or coupled.

In this embodiment, the state detection apparatus for the folding screen is configured to detect a folded state or an unfolded state of the two display screens 3. It can be seen from the above contents that, at least one of the first component 11 and the second component 12 of the connection assembly 1 in the state detection apparatus is arranged on the rotating shaft assembly 4, while the detection assembly 2 of the state detection apparatus may be arranged on the rotating shaft assembly 4, or arranged on the display screen 3 of the folding screen apparatus, or arranged simultaneously on the rotating shaft assembly 4 and the display screen 3.

Specifically, the power supply VDD in the detection assembly 2 is electrically coupled to the first component 11 in the connection assembly 1. The ground terminal GND in the detection assembly 2 is electrically coupled to the second component 12. The detection unit in the detection assembly 2 is coupled to one of the first component 11 and the second component 12. Therefore, the detection unit determines, according to an electrical signal indicating the electrical conduction connection or disconnection state between the first component 11 and the second component 12, a folded state or an unfolded state of the two display screens 3 of the folding screen apparatus.

When the first component 11 and the second component 12 in the connection assembly 1 are both arranged on the rotating shaft assembly 4 of the folding screen apparatus, it can be seen from the above contents that the first component 11 and the second component 12 are respectively arranged on or coupled to a shaft sleeve and a shaft lever of a shaft lever assembly in the folding screen apparatus, and the shaft sleeve and the shaft lever are respectively coupled to the relatively movable screen and the relatively stationary screen. Therefore, the power supply VDD and the ground terminal GND are respectively arranged on the relatively movable screen and the relatively stationary screen, or the power supply VDD and the ground terminal GND are both arranged on the relatively movable screen or the relatively stationary screen, or the power supply VDD and the ground terminal GND are respectively arranged on the shaft sleeve and the shaft lever of the rotating shaft assembly 4, or the power supply VDD and the ground terminal GND are both arranged on the shaft sleeve or the shaft lever, or the power supply VDD is arranged on the display screen 3 and the ground terminal GND is arranged on the shaft sleeve or the shaft lever of the rotating shaft assembly 4. The detection unit in the detection assembly 2 is coupled to one of the first component 11 and the second component 12. Similarly, the detection unit may also be arranged on the relatively movable screen or the relatively stationary screen, or arranged on the rotating shaft assembly 4.

When one of the first component 11 and the second component 12 in the connection assembly 1 is arranged on the rotating shaft assembly 4 of the folding screen apparatus, it can be seen from the above contents that the first component 11 and the second component 12 are respectively arranged on or coupled to two shaft sleeves of a shaft lever assembly in the folding screen apparatus, and the two shaft sleeves are respectively coupled to the relatively movable screen and the relatively stationary screen. Therefore, the power supply VDD and the ground terminal GND are respectively arranged on the relatively movable screen and the relatively stationary screen, or the power supply VDD and the ground terminal GND are both arranged on the relatively movable screen or the relatively stationary screen, or the power supply VDD and the ground terminal GND are respectively arranged on the shaft sleeve and the shaft lever of the rotating shaft assembly 4, or the power supply VDD and the ground terminal GND are both arranged on the shaft sleeve or the shaft lever. The detection unit in the detection assembly 2 is coupled to one of the first component 11 and the second component 12. Similarly, the detection unit may also be arranged on the relatively movable screen or the relatively stationary screen, or may be arranged on the rotating shaft assembly 4.

Based on the above description, the detection assembly 2 in the state detection apparatus may be arranged at any position in the folding screen apparatus provided that the power supply VDD is electrically coupled to the first component 11, the ground terminal GND is electrically coupled to the second component 12, and the detection unit is coupled to one of the first component 11 and the second component 12.

Based on the same inventive conception, embodiments of the present disclosure further provide a terminal device, including the folding screen apparatus in the above embodiments.

In this embodiment, the terminal device includes, but is not limited to a mobile phone, a tablet computer, a wearable smart device, medical instrument and other mobile electronic devices.

All the above terminal devices may have at least two display screens 3, and further include a state detection apparatus for a folding screen. A rotating shaft assembly 4 is arranged between two adjacent display screens 3. The rotating shaft assembly 4 is configured to pivot the two adjacent display screens 3 to enable the two adjacent display screens 3 of the folding screen to be folded or unfolded. The state detection apparatus is configured to detect a folded state or an unfolded state of the folding screen of the adjacent display screens 3. For example, when the state detection apparatus detects that the two adjacent display screens 3 of the terminal device are in the folded state, the folding screen of the terminal device is in a turned-off state. When the state detection apparatus detects that display screens 3 of a mobile phone or tablet are in the unfolded state, the folding screen of the terminal device is in a turned-on state.

In addition, the state detection apparatus includes a connection assembly 1 and a detection assembly 2. When the state detection apparatus is arranged on the terminal device, the first component 11 and/or the second component 12 of the connection assembly 1 is/are arranged on the rotating shaft assembly 4, and the detection assembly 2 of the state detection apparatus may also be arranged on the rotating shaft assembly 4 or arranged on the display screen 3, or arranged simultaneously on the rotating shaft assembly 4 and the display screen 3 as well as on a housing of the terminal device.

It can be seen from the above that, the state detection apparatus may be applied to any terminal device with a folding screen, and has strong universality, and in addition, is designed with a simple structure, can make up parts of the rotating shaft assembly 4 in the terminal device, and only requires addition of a detection circuit, which can also detect a folded state or an unfolded state of the folding screen while reducing the parts, thereby saving the stacking space of the whole machine.

Based on the same inventive conception, embodiments of the present disclosure further provide a state detection method for a folding screen, applied to the state detection apparatus in the above embodiments. The method includes: acquiring an electrical signal indicating conduction or disconnection of the first component 11 and the second component 12; and determining a state of the folding screen based on the electrical signal.

In this embodiment, the state detection apparatus includes: at least one connection assembly 1 each including a first component 11 and a second component 12; and a detection assembly 2 including a power supply VDD, a ground terminal GND, and a detection unit, the power supply VDD being electrically coupled to the first component 11, the ground terminal GND being electrically coupled to the second component 12, and the detection unit being electrically coupled to one of the first component 11 and the second component 12.

Therefore, acquiring an electrical signal indicating conduction or disconnection of the first component 11 and the second component 12 and determining the state of the folding screen based on the electrical signal mean that: the first component 11 and the second component 12 are correspondingly electrically conductively coupled or decoupled according to the state of the folding screen, and when the first component 11 and the second component 12 are electrically conductively coupled, an electrical signal is generated, so that the detection unit in the detection assembly 2 can capture the electrical signal to determine whether the folding screen is in a folded state or an unfolded state.

Specifically, it is initially designed that the folding screen is in the unfolded state when the first component 11 and the second component 12 are electrically conductively coupled and the folding screen is in the folded state when the first component 11 and the second component 12 are decoupled, so when the detection unit captures the electrical signal, it is determined that the folding screen is in the unfolded state, and when the detection unit cannot capture the electrical signal, it is determined that the folding screen is in the folded state. It is initially designed that the folding screen is in the folded state when the first component 11 and the second component 12 are electrically conductively coupled and the folding screen is in the unfolded state when the first component 11 and the second component 12 are decoupled, so when the detection unit captures the electrical signal, it is determined that the folding screen is in the folded state, and when the detection unit cannot capture the electrical signal, it is determined that the folding screen is in the unfolded state.

It can be seen that, the method in this embodiment only requires addition of the detection assembly 2 on the basis of the original design structure, so that the original design structure can generate electrical conduction or disconnection upon connection or disconnection, so as to capture an electrical signal. The detection assembly 2 uses the electrical signal to determine whether the folding screen is in the folded state or the unfolded state. The circuit structure is also simple, and the steps of the previous detection methods are simplified. The method is easy to operate, easy to implement, and highly universal, can be applied to any terminal device with a folding screen, has a high degree of standardization is high, and is easy to replace when the parts are damaged. The method saves manpower, material and financial resources, and also reduces process costs and power consumption of parts.

It may be understood that "a plurality of" in the present disclosure means two or more, and other quantifiers are similar thereto. The term "and/or" describes an association relationship between associated objects and represents that three relationships may exist. For example, A and/or B may represent the following three cases: only A exists, both A and B exist, and only B exists. The symbol "/" generally indicates an "or" relationship between the associated objects. The singular forms "a," "an," and "the" are intended to include the plural forms as well, unless clearly specified otherwise.

It may be further understood that, the terms such as "first" and "second" are used to describe various information, but the information should not be limited to these terms. These terms are used only to distinguish information of the same type from each other and do not indicate a particular order or degree of importance. In fact, expressions such as "first" and "second" are completely interchangeable. For example, without departing from the scope of the present disclosure, first information may also be referred to as second information, and similarly, the second information may also be referred to as the first information.

It may be further understood that, terms such as "central," "longitudinal," "transverse," "front," "rear," "upper," "lower," "left," "right," "vertical," "horizontal," "top," "bottom," "inner," and "outer" should be construed to refer to the orientation as then described or as shown in the drawings under discussion. These relative terms are for convenience of description and do not require that the apparatus or element referred to be constructed or operated in a particular orientation.

It may be further understood that, unless otherwise stated, "connection" includes a direct connection in which no other component exists between the two and an indirect connection in which other components exist between the two.

It may be further understood that, in the embodiments of the present disclosure, while operations are depicted in the drawings in a particular order, this should not be understood as requiring that such operations be performed in the particular order shown or in sequential order, or that all illustrated operations be performed, to achieve desirable results. In particular environments, multitasking and parallel processing may be advantageous.

After considering the specification and practicing the invention disclosed herein, those skilled in the art would easily conceive of other implementations of the present disclosure. The present application is intended to cover any variation, use, or adaptive change of the present disclosure. These variations, uses, or adaptive changes follow the general principles of the present disclosure and include common knowledge or common technical means in the art that are not disclosed in the present disclosure. The specification and the embodiments are considered as merely exemplary, and the real scope of the present disclosure are pointed out in the following claims.

It is to be understood that the present disclosure is not limited to the precise structures described above and shown in the accompanying drawings, and various modifications and changes can be made without departing from the scope thereof. The scope of the presently claimed invention is limited only by the appended claims.

What is claimed is:

1. A state detection apparatus for a folding screen, wherein the state detection apparatus comprises:
   at least one connection assembly, comprising a first component and a second component, the first component and the second component being electrically conductively coupled or decoupled correspondingly according to a motion state of the folding screen; and
   a detection assembly electrically coupled to the at least one connection assembly, and configured to detect a state of electrical conduction connection or disconnection between the first component and the second component and determine a state of the folding screen according to the state of electrical conduction connection or disconnection between the first component and the second component, wherein the first component has a U-shaped structure with an opening, an elastically deformable portion being arranged at the opening, and the second component has a first end portion;

a minimum radial size of the opening is less than a maximum radial size of the first end portion, the first end portion is inserted into the first component by elastic deformation of the elastically deformable portion, and elastically deformable portions are located on two sides in an insertion direction.

2. The state detection apparatus according to claim 1, wherein the at least one connection assembly is configured to:

make the first component and the second component electrically conductively coupled when the folding screen is in an unfolded state, and make the first component and the second component decoupled when the folding screen is in a folded state; or make the first component and the second component decoupled when the folding screen is in an unfolded state, and make the first component and the second component electrically conductively coupled when the folding screen is in a folded state.

3. The state detection apparatus according to claim 1, wherein at least one of the first component and the second component is arranged on a rotating shaft assembly of the folding screen, and rotates circumferentially around a central axis of the rotating shaft assembly as the folding screen is unfolding or folding.

4. The state detection apparatus according to claim 1, wherein the detection assembly comprises:

a power supply electrically coupled to the first component;

a ground terminal electrically coupled to the second component; and a detection unit electrically coupled to one of the first component and the second component, and configured to determine the state of the folding screen according to an electrical signal indicating the state of electrical conduction connection or disconnection between the first component and the second component.

5. The state detection apparatus according to claim 4, wherein the detection assembly further comprises: a resistor coupled in series between the power supply and the first component.

6. The state detection apparatus according to claim 1, wherein the first component and the second component each comprise a conductor portion, wherein the conductor portion of the first component is in contact with the conductor portion of the second component, and the first component is in electrical conduction with the second component.

7. The state detection apparatus according to claim 3, wherein a plurality of connection assemblies is arranged at equal intervals along the central axis of the rotating shaft assembly.

8. The state detection apparatus according to claim 3, wherein the rotating shaft assembly comprises a shaft lever and at least one shaft sleeve fitted over an outer side of the shaft lever and circumferentially rotatable relative to the shaft lever.

9. The state detection apparatus according to claim 1, wherein the elastically deformable portion of the first component and the first end portion of the second component have the same shape.

10. The state detection apparatus according to claim 1, wherein the second component has a second end portion, and a maximum radial size of the second end portion is less than the maximum radial size of the first end portion.

11. The state detection apparatus according to claim 1, wherein the first component is rounded at the opening, and the second component is rounded at the maximum radial size of the first end portion.

12. A folding screen apparatus, comprising:

a foldable display screen and a rotating shaft assembly, wherein the rotating shaft assembly is arranged in a folding position of the foldable display screen, and the foldable display screen is able to unfold or fold through the rotating shaft assembly; and a state detection apparatus for the foldable display screen, the state detection apparatus comprising:

at least one connection assembly, comprising a first component and a second component, the first component and the second component being electrically conductively coupled or decoupled correspondingly according to a motion state of the foldable display screen; and a detection assembly electrically coupled to the at least one connection assembly, and configured to detect a state of electrical conduction connection or disconnection between the first component and the second component and determine a state of the foldable display screen according to the state of electrical conduction connection or disconnection between the first component and the second component, wherein at least one of the first component and the second component in the state detection apparatus is arranged on the rotating shaft assembly, and rotates circumferentially around a central axis of the rotating shaft assembly as the foldable display screen is unfolding or folding, wherein the first component has a U-shaped structure with an opening, an elastically deformable portion being arranged at the opening, and the second component has a first end portion;

a minimum radial size of the opening is less than a maximum radial size of the first end portion, the first end portion is inserted into the first component by elastic deformation of the elastically deformable portion, and elastically deformable portions are located on two sides in an insertion direction.

13. The folding screen apparatus according to claim 12, wherein the foldable display screen is a flexible display screen or comprises two separate display screens pivotally coupled through the rotating shaft assembly.

14. The folding screen apparatus according to claim 13, wherein the rotating shaft assembly comprises a shaft lever and one shaft sleeve fitted over an outer side of the shaft lever and circumferentially rotatable relative to the shaft lever.

15. The folding screen apparatus according to claim 14, wherein the two separate display screens are coupled to the shaft lever and the shaft sleeve respectively, and one of the first component and the second component is coupled to the shaft lever while the other one of the first component and the second component is coupled to the shaft sleeve.

16. The folding screen apparatus according to claim 12, wherein the detection assembly comprises:

a power supply electrically coupled to the first component;

a ground terminal electrically coupled to the second component; and a detection unit electrically coupled to one of the first component and the second component, and configured to determine the state of the foldable display screen according to an electrical signal indicating the state of electrical conduction connection or disconnection between the first component and the second component.

17. A state detection method for a folding screen, applied to a state detection apparatus for the folding screen, wherein the state detection apparatus comprises:
   at least one connection assembly, comprising a first component and a second component, the first component and the second component being electrically conductively coupled or decoupled correspondingly according to a motion state of the folding screen; and
   a detection assembly electrically coupled to the at least one connection assembly, and configured to detect a state of electrical conduction connection or disconnection between the first component and the second component and determine a state of the folding screen according to the state of electrical conduction connection or disconnection between the first component and the second component, and wherein the first component has a U-shaped structure with an opening, an elastically deformable portion being arranged at the opening, and the second component has a first end portion;

a minimum radial size of the opening is less than a maximum radial size of the first end portion, the first end portion is inserted into the first component by elastic deformation of the elastically deformable portion, and elastically deformable portions are located on two sides in an insertion direction, wherein the state detection method comprises:

acquiring an electrical signal indicating conduction or disconnection between the first component and the second component; and determining the state of the folding screen based on the electrical signal.

* * * * *